United States Patent [19]

Wu

[11] Patent Number: 5,059,974
[45] Date of Patent: Oct. 22, 1991

[54] METHOD FOR DETERMINING PHANTOM SWITCH CONDITION

[75] Inventor: Dennis Wu, Kao-Hsiung Hsien, China

[73] Assignee: Acer Incorporated, China

[21] Appl. No.: 305,946

[22] Filed: Feb. 2, 1989

[51] Int. Cl.[5] .................. H03M 11/00; G06F 3/02; H04L 1/00; G08C 25/00
[52] U.S. Cl. .................................. 341/25; 341/24; 341/26; 400/477; 400/479; 364/900; 364/928
[58] Field of Search .................. 341/25, 24, 26; 364/200 MS File, 900 MS File, 709.06; 400/477, 479

[56] References Cited

U.S. PATENT DOCUMENTS

| 4,417,824 | 11/1983 | Paterson et al. | 400/477 |
|---|---|---|---|
| 4,420,744 | 12/1983 | Jesson | 341/25 |
| 4,633,228 | 12/1986 | Larson | 341/26 |
| 4,794,375 | 12/1988 | Morris et al. | 341/25 |
| 4,918,444 | 4/1990 | Matsubayashi | 341/25 |
| 4,922,248 | 5/1990 | Shiga | 341/25 |

FOREIGN PATENT DOCUMENTS

| 0072471 | 7/1982 | European Pat. Off. . |
| 2162351 | 1/1986 | United Kingdom . |
| 0229695 | 7/1987 | United Kingdom . |

OTHER PUBLICATIONS

"Solution to Phantom Key Problems"–IBM Technical Disclosure Bulletin–vol. 28, No. 5, Oct./85–pp. 1914–1919.

Bolt et al.,–"Phantom Key Detection/Phantom Key Scan Code"–vol. 27, No. 7A, Dec/84–p. 4109.

Primary Examiner—Michael R. Fleming
Assistant Examiner—Gopal C. Ray
Attorney, Agent, or Firm—Andrus, Sceales, Starke & Sawall

[57] ABSTRACT

A method of determining a phantom key condition in an encoder array (10) including (1) enabling each row (R1–R14) of the encoder to a high position; (2) pulling the first row (R1) to be scanned to a low position; (3) scanning the first row (R1) of which in the low position finding whether there is a first key being closed, (4) determining whether there is second key being closed in the first column (C2) of which the first key has been closed, if there isn't a second key being closed, then outputting the signal, if there is a second key being closed, then (5) determining whether there is a third key being closed in the second row of which a second key has been closed before, if there isn't a third key that exists, output the signal, if a third key exists in the second row, (6) then the phenomenon of a phantom exists and the inputting signals will be invalid and beeper sound is emitted to warn the typist.

7 Claims, 5 Drawing Sheets

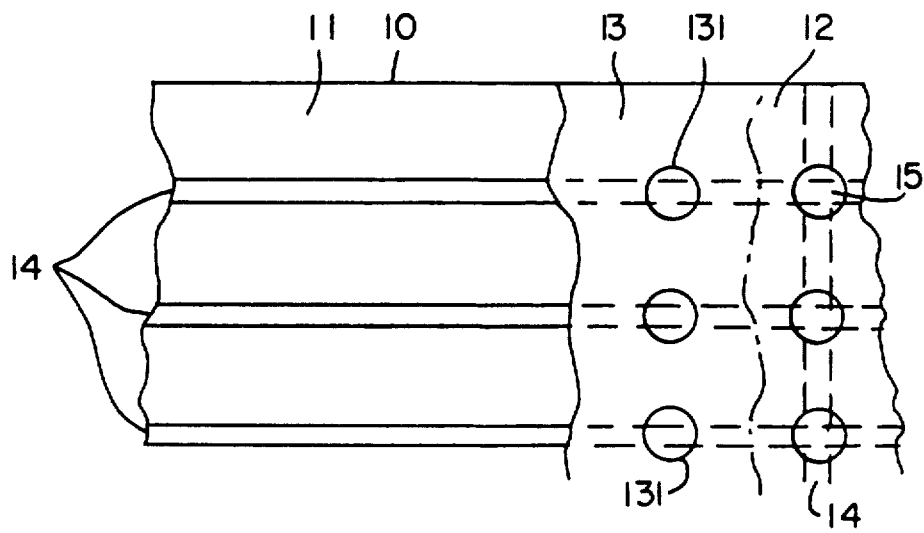
FIG. IA
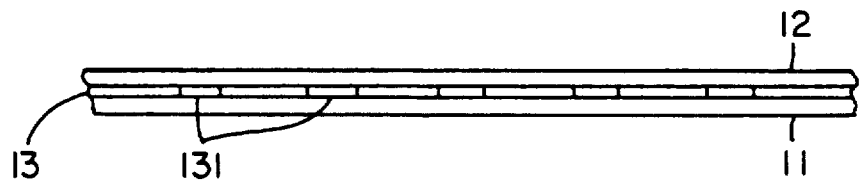
FIG. IB

METHOD FOR DETERMINING PHANTOM SWITCH CONDITION

BACKGROUND OF THE INVENTION

1. Field of the Invention

The present invention relates to a method and apparatus for determining whether a phantom switch condition exists in an encoder array.

2. Description of the Related Art

Typical encoder arrays, for example for a typewriter keyboard have a plurality of conductors which are normally spaced apart. Each intersection of a row and column constitutes a crosspoint switch and can be closed by pressing the conductors together, usually through a switch mechanism actuated by a key. Typically, the conductors are manufactured on sheets of flexible material so that one conductor can contact the other conductor when subjected to an external force, generated by the appropriate switch mechanism. As the external force is removed, the sheet will return to its original condition, i.e. non-contact position. This kind of encoder is always used together with a CPU to generate inputting signals and also with typewriters, processors, computer terminals etc.

One of the problems is that the processing circuitry must be capable of handling the simultaneous closure of two or more crosspoint switches. This situation can occur as an operator presses a second or third key before releasing a first or second key. This overlapping of closed switches is referred to as rollover.

Basically, there are three methods of handling a simultaneous crosspoint closure situation. In the "no-rollover" method only the first key stroke is recognized and provides a valid output signal. Once a crosspoint is closed no other key will be recognized as valid output data until the first key is released. In the "two-key rollover" method, the first and second keys will be recognized as valid and corresponding data will be outputted while other keys will not be recognized as valid. In the "N-key rollover" method, a plurality of the crosspoints can be pressed at the same time and each closure can be recognized and deliver a valid output data.

A major problem of the N-key rollover in crosspoint encoders is the so-called phantom key or phantom switch situation. This will be described in detail below. Briefly, a phantom switch condition arises when three switches in a rectangular pattern in the encoder's matrix are depressed simultaneously. This results in an electrical path being formed which falsely indicates to the processing circuitry that the crosspoint at the fourth corner of the rectangle is closed. If nothing is done to correct this phantom switch condition, the result would be the generation of an output signal corresponding to a switch which has never been pressed.

This problem can be simply solved by limiting the encoder to no rollover or two-key rollover, but this will eliminate the benefits of the N-key rollover for high speed typing.

The above methods are all software based. This phantom key condition can also be solved through installing a diode between two conductors. But this cannot be applied to a membrane switch and it costs too much.

U.S. Pat. No. 4,420,744 (hereinafter referred to as '744) teaches a method which can determine whether there is a phantom key condition in an encoder matrix. In U.S. '744, the status of each crosspoint switch is determined and stored in an array. This array is then scanned by selecting a pair of rows in the array, comparing the information in each column position of the rows to determine if there are two columns where each row indicates a closed crosspoint switch, and repeating the above selecting and comparing steps until all combinations of row pairs has been selected.

In the method described in '744, a valid signal is outputted only after repeating all comparisons of combinations of row pairs. However this takes much time, since it needs to compare all combinations and also requires an initial scan of the entire matrix.

GB-A-2162351 describes a similar method for determining the phantom key condition from an array representing the status of each crosspoint switch.

SUMMARY OF THE PRESENT INVENTION

In accordance with the present invention, a method of determining a phantom switch condition in an encoder array comprising an array of switches connected together in rows and columns by respective sets of rows and column conductors comprises a) scanning each row in sequence to sense if one or more switches in that row is actuated.

b) if at least two switches are actuated, scanning a column containing one of the switches to sense if another switch in that column is actuated; and c) if another actuated switch is sensed determining a phantom switch condition.

The purpose of the present invention is to provide a method, referred to as "cross" method, which can easily and quickly determine whether there is a phantom key in the encoder array. This is achieved in a much shorter time than before since a full array indicating the condition of each switch does not have to be created.

BRIEF DESCRIPTION OF THE DRAWING

An example of a method according to the present invention will now be described with reference to the accompanying drawings, in which:

FIG. 1A is a partially cut-away top plan view of a membrane keyboard crosspoint encoder;

FIG. 1B is a cross-section through the encoder;

DESCRIPTION OF THE PREFERRED EMBODIMENT

Figure 2:
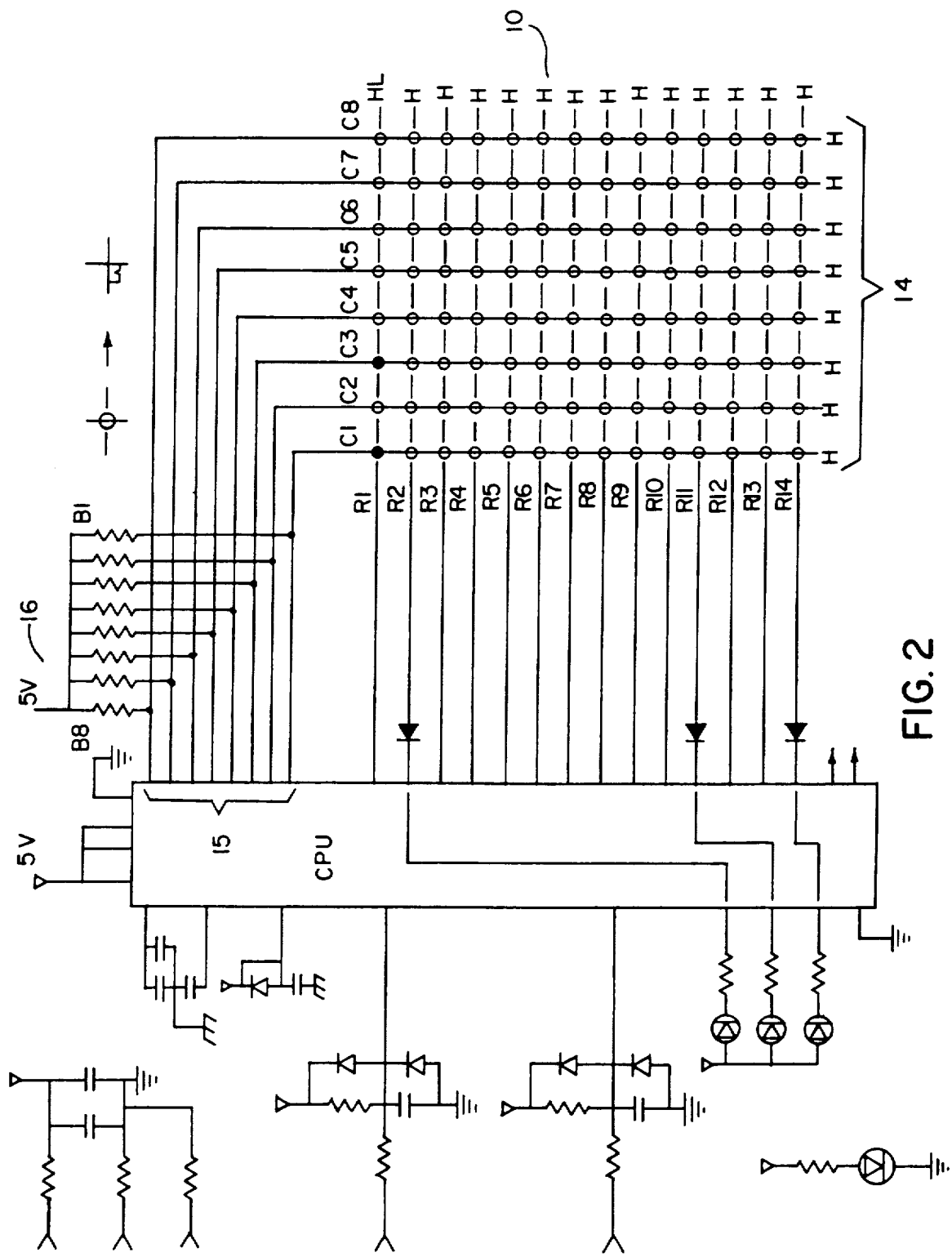
FIGS. 2 to 4 are schematic circuit diagrams of the apparatus in three different conditions; and, FIG. 5 is a block diagram showing the steps of the operation of the method.

FIGS. 1A and 1B illustrate a typical membrane crosspoint encoder 10. The encoder comprises two plastics layers 11, 12 and an insulative material spacer 13 which has many holes 131. Facing surfaces of the upper and lower layers 11, 12 have a plurality of conductors 14 arranged in matrix of orthogonal rows and columns on the layers 11, 12 respectively. A hole 131 is provided in the spacer 13 at the intersection of each pair of the conductors 14 so as to constitute a crosspoint switch 15. In the normal position, the conductors will be spaced apart by the spacer 13. If an external force is applied through a switch mechanism (not shown) on the upper layer 11 it will contact with the lower layer 12, and the pair of conductors adjacent the point of application of the force will contact to constitute a switch closure. As the conductors are depressed, a CPU (not shown in FIG. 1) to which the conductors are connected will send a signal to determine which crosspoints are depressed. If those depressed crosspoints do not constitute a phantom switch condition, then the CPU will transfer those signals (representing letters/numbers etc.) to the device incorporating the encoder such as a word processor. If the phantom condition is detected, a beeper will sound to advise the typist and no representative signals will be passed to the word processor.

FIG. 2 illustrates the conductors 14 of the encoder 10 arranged in rows and columns. Each row is designated from R1 to R14 and each column is designated from C1 to C8. The conductors are coupled with a CPU 1.

The CPU 1 has eight read out ports 15 connected to respective column conductors 14, each of the column conductors 14 also being connected to a five volt line 16 via respective bit lines B1-B8.

Figure 5:
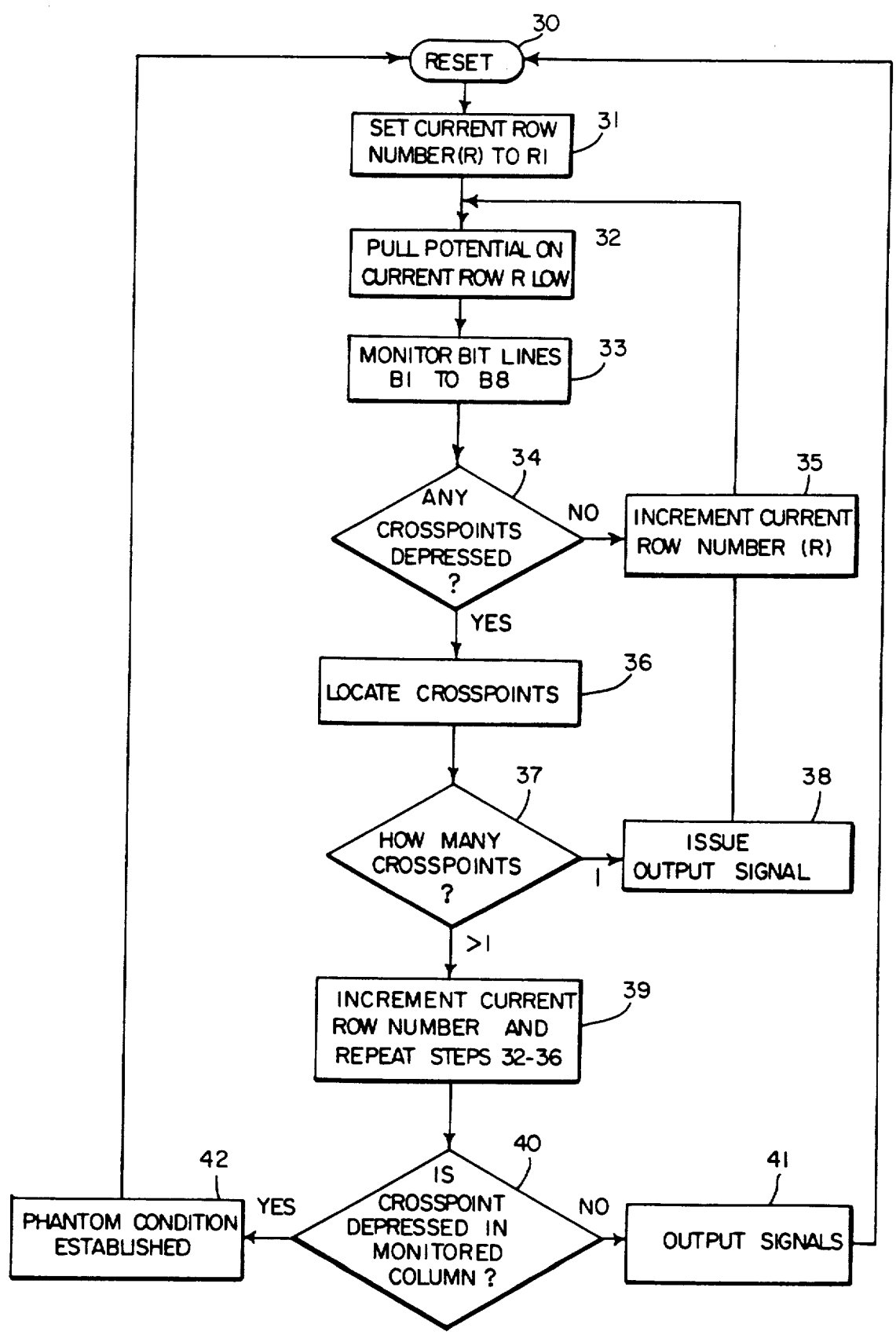

In operation, the CPU 1 regularly scans the encoder 10 to determine if any of the crosspoints has been depressed. Consider firstly the example shown in FIG. 2 when the crosspoints R1, C1 and R1, C3 have been depressed. After reset 30 (FIG. 5) the CPU 1 pulls all the rows and columns to a high potential H and then scans each row R1-R14 in series. This is achieved initially by setting a current row number R to row R1 (step 31) and then pulling low the potential on the current row (step 32). The potentials on the column conductors C1-C8 are then monitored by the CPU 1 via the read out ports 15 with the potential on each line corresponding to a bit value B1-B8. This bit value is set at 1 if the potential is High and to "0" if the potential is low. A low potential L indicates that a crosspoint in the corresponding column has been depressed since the low potential in the current row will be communicated via the crosspoint to the column. Thus, after monitoring row R1, the CPU 1 will determine a read out value corresponding to bits B1-B8 of the form:

101 1111

This is coded in hexadecimal as 5F. The CPU 1 then compares this read out value 5F with the value which would be expected if no crosspoints were depressed i.e. 7F (step 34). If there was no change, the current row number R is incremented (step 35) and then steps 32-34 are repeated.

If at least one crosspoint is detected as being depressed then the CPU 1 determines which crosspoint or crosspoints are concerned (step 36). The CPU 1 also determines how many crosspoints are sensed as being depressed (step 37) and if only one is detected then the CPU 1 outputs a signal corresponding to the meaning of the crosspoint, for example a letter or numeral, (step 38) since this will be unambiguously determined i.e. there is no phantom condition. Processing then returns to step 35.

If more than one crosspoint has been detected as being depressed in the current row then there is the possibility of a phantom condition. In this example this condition exists and the CPU 1 continues scanning the remaining rows R2-R14 in a series of 13 scanning steps (step 39) and monitors whether there is a crosspoint depressed in one of the columns in which there is also a depressed crosspoint in row R1. In the present example, the columns concerned will be columns C1 and C3 and in the FIG. 2 case, no further crosspoints will be detected. Thus following a determination at each scanning step as to whether a crosspoint in one of the monitored columns has been depressed (step 40), the CPU 1 will issue output signals (step 41) representing the meaning of the crosspoints which are depressed in row R1.

It should be understood that the CPU 1 can simply monitor one of the columns either C1 or C3.

The table below illustrates the scanning sequence in terms of the potentials of each of the rows R1-R14 during the 14 scanning steps.

TABLE

| ROW | SCANNING SEQUENCE ON ROWS | | | | | | | | | | | | | |
|---|---|---|---|---|---|---|---|---|---|---|---|---|---|---|
| | 1ST | 2ND | 3RD | 4TH | 5TH | 6TH | 7TH | 8TH | 9TH | 10TH | 11TH | 12TH | 13TH | 14TH |
| 1 | 0 | 1 | 1 | 1 | 1 | 1 | 1 | 1 | 1 | 1 | 1 | 1 | 1 | 1 |
| 2 | 1 | 0 | 1 | 1 | 1 | 1 | 1 | 1 | 1 | 1 | 1 | 1 | 1 | 1 |
| 3 | 1 | 1 | 0 | 1 | 1 | 1 | 1 | 1 | 1 | 1 | 1 | 1 | 1 | 1 |
| 4 | 1 | 1 | 1 | 0 | 1 | 1 | 1 | 1 | 1 | 1 | 1 | 1 | 1 | 1 |
| 5 | 1 | 1 | 1 | 1 | 0 | 1 | 1 | 1 | 1 | 1 | 1 | 1 | 1 | 1 |
| 6 | 1 | 1 | 1 | 1 | 1 | 0 | 1 | 1 | 1 | 1 | 1 | 1 | 1 | 1 |
| 7 | 1 | 1 | 1 | 1 | 1 | 1 | 0 | 1 | 1 | 1 | 1 | 1 | 1 | 1 |
| 8 | 1 | 1 | 1 | 1 | 1 | 1 | 1 | 0 | 1 | 1 | 1 | 1 | 1 | 1 |
| 9 | 1 | 1 | 1 | 1 | 1 | 1 | 1 | 1 | 0 | 1 | 1 | 1 | 1 | 1 |
| 10 | 1 | 1 | 1 | 1 | 1 | 1 | 1 | 1 | 1 | 0 | 1 | 1 | 1 | 1 |
| 11 | 1 | 1 | 1 | 1 | 1 | 1 | 1 | 1 | 1 | 1 | 0 | 1 | 1 | 1 |
| 12 | 1 | 1 | 1 | 1 | 1 | 1 | 1 | 1 | 1 | 1 | 1 | 0 | 1 | 1 |
| 13 | 1 | 1 | 1 | 1 | 1 | 1 | 1 | 1 | 1 | 1 | 1 | 1 | 0 | 1 |
| 14 | 1 | 1 | 1 | 1 | 1 | 1 | 1 | 1 | 1 | 1 | 1 | 1 | 1 | 0 |

1 REPRESENTS AS HIGH POTENTIAL DURING SCANNING PROCESS
0 REPRESENTS AS LOW POTENTIAL DURING SCANNING PROCESS
COLUMN REMAINS HIGH POTENTIAL DURING SCANNING

Figure 3:
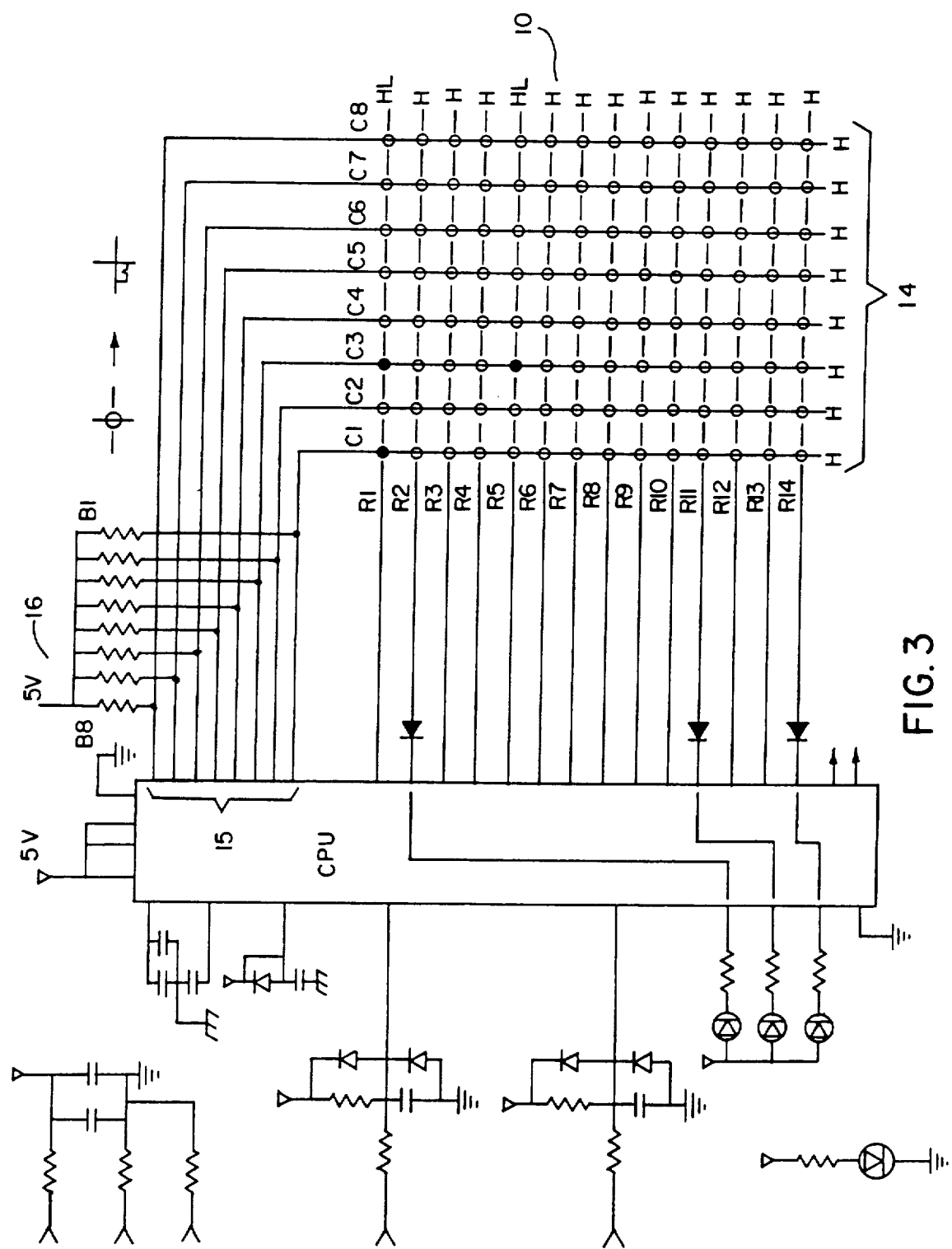

In the FIG. 3 example, a further crosspoint is depressed at R5, C3. The depression of this crosspoint simultaneously with the depressed crosspoints in row R1 will have the effect of implying that the crosspoint R5, C1 has been depressed i.e. the phantom key condition even though that crosspoint R5, C1 has not been depressed. By following the process just described, the CPU 1 will determine in step 40 that there is a depressed crosspoint in column C1 or column C3 indicating that the phantom condition is established (step 42) and thus no signals will be issued and processing will return to the reset condition 30.

Figure 4:
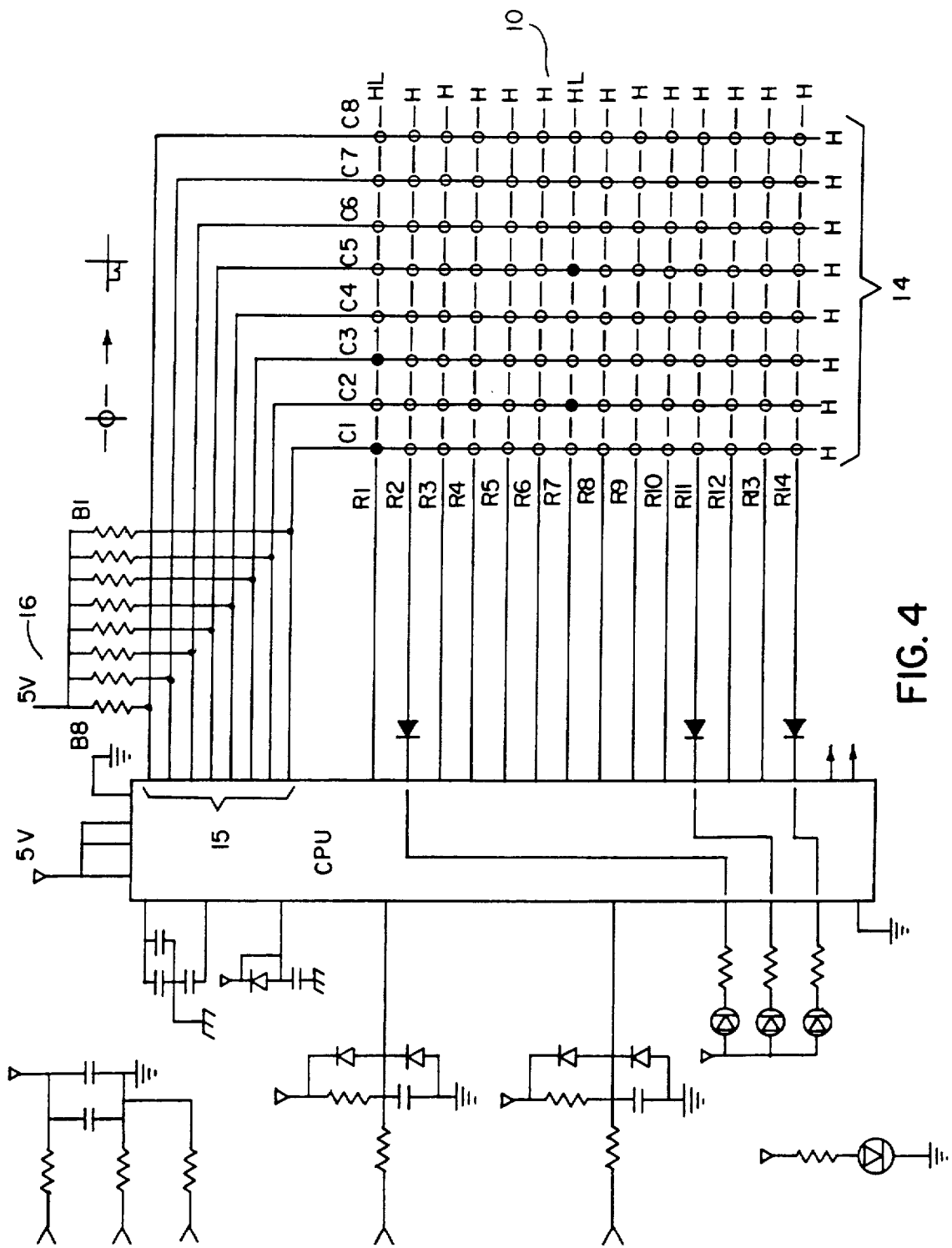

A further possibility is illustrated in FIG. 4 in which four crosspoints are depressed, the two in row 1 previously mentioned and the crosspoints at R7, C2 and R7, C5. However, in the FIG. 4 case the phantom key condition does not exist since there is no closed circuit containing the crosspoints which are depressed and consequently by following the processing described above, the CPU 1 will accurately detect which of the four crosspoints is detected and will determine that there is not a depressed crosspoint in the same column as either of the depressed crosspoints in R1. Consequently, four valid signals will be output by the CPU 1 representing the meaning of the depressed crosspoints.

In the case where the phantom condition is established, the CPU may generate a warning signal which is preferably audible so that the operator knows that the most recent key strokes have not been input to the CPU 1.

I claim:

1. A method of determining a phantom switch condition in an encoder array and for controlling the issuance of array condition signals responsive to the presence or absence of a phantom switch condition, the array having a matrix of conductors set in intersecting rows and columns, said conductors being electrically interconnectable by a switch at each intersection of a row and column, said method comprising the steps of:
   (a) placing the array in a condition in which actuation of the switches can be detected by scanning the rows and detecting switch actuation in the columns;
   (b) scanning each row to detect whether two or more switches in the scanned row are actuated;
   (c) if two or more switches in the scanned row are not detected as being actuated in step (b), issuing array condition signals in accordance with the actuated switch;
   (d) if two or more switches are detected as being actuated in step (b), further detecting whether another switch in the same column as that of a switch detected in step (b) is actuated;
   (e) if another switch is detected as being actuated in step (d), so that a phantom switch condition exists in the array, preventing issuance of array condition signals; and
   (f) if another switch is not detected as being actuated in step (d), issuing array condition signals corresponding to all actuated switches in the array.

2. The method according to claim 1 wherein the encoder array has associated therewith means for controlling the potential applied to the conductors, wherein step (a) is further defined as setting the potential of the row and column conductors to a common first level, and wherein step (b) is further defined as sequentially changing the potential of each row conductor to a second, different level, while retaining the other row conductors at the common first level, and detecting the actuation of the switches by sensing whether the potential on the column conductors is at the second level.

3. The method according to claim 1 wherein the encoder array has associated therewith means for controlling the potential applied to the conductors, wherein step (a) is further defined as setting the potential of the row and column conductors to a common first level, and wherein step (d) is further defined as sequentially changing the potential of each row conductor to a second, different level while retaining the other row conductors at the common first level and detecting the actuation of the switches by sensing whether the potential on the column conductors is at the second level.

4. The method according to claim 2 wherein step (d) is further defined as detecting the actuation of another switch by sensing whether the potential on the column conductors is at the second level.

5. The method according to claim 2 wherein step (a) is further defined as setting the potential of the row and column conductors to a common high level, and wherein step (b) is further defined as sequentially changing the potential of each row conductor to a second, low level while retaining the other row conductors the first high level.

6. The method according to claim 3 wherein step (a) is further defined as setting the potential of the row and column conductors to a common high level, and wherein step (d) is further defined as sequentially changing the potential of each row conductor to a second, low level while retaining the other row conductors at the first high level.

7. The method according to claim 1 wherein step (e) is further defined as issuing a warning signal that a phantom switch condition exists.

* * * * *